(12) United States Patent
Doyle et al.

(10) Patent No.: US 6,972,228 B2
(45) Date of Patent: Dec. 6, 2005

(54) METHOD OF FORMING AN ELEMENT OF A MICROELECTRONIC CIRCUIT

(75) Inventors: Brian S. Doyle, Portland, OR (US); Anand S. Murthy, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/387,623

(22) Filed: Mar. 12, 2003

(65) Prior Publication Data

US 2004/0180499 A1 Sep. 16, 2004

(51) Int. Cl.$^7$ .......................................... H01L 21/8242
(52) U.S. Cl. ...................... 438/256; 438/149; 438/164; 438/197; 438/199; 438/413
(58) Field of Search ................................. 438/149, 164, 438/197, 199, 256, 413, 176, 283, 304, 717, 481, 503; 117/88, 97, 106, 95, 94

(56) References Cited

U.S. PATENT DOCUMENTS

| | | | |
|---|---|---|---|
| 4,838,991 A | * | 6/1989 | Cote et al. ..................... 216/46 |
| 4,938,456 A | * | 7/1990 | Richards ...................... 266/194 |
| 4,948,456 A | * | 8/1990 | Schubert ....................... 117/90 |
| 4,999,314 A | | 3/1991 | Pribat et al. |
| 5,122,476 A | | 6/1992 | Fazan et al. |
| 5,294,564 A | | 3/1994 | Karapiperis et al. |
| 5,328,868 A | | 7/1994 | Conti et al. |
| 6,413,802 B1 | * | 7/2002 | Hu et al. ..................... 438/151 |
| 6,706,571 B1 | * | 3/2004 | Yu et al. ..................... 438/157 |

* cited by examiner

*Primary Examiner*—George Fourson
*Assistant Examiner*—Julio J. Maldonado
(74) *Attorney, Agent, or Firm*—Blakely, Sokoloff, Taylor & Zafman LLP

(57) ABSTRACT

A method is described for forming an element of a microelectronic circuit. A sacrificial layer is formed on an upper surface of a support layer. The sacrificial layer is extremely thin and uniform. A height-defining layer is then formed on the sacrificial layer, whereafter the sacrificial layer is etched away so that a well-defined gap is left between an upper surface of the support layer and a lower surface of the height-defining layer. A monocrystalline semiconductor material is then selectively grown from a nucleation silicon site through the gap. The monocrystalline semiconductor material forms a monocrystalline layer having a thickness corresponding to the thickness of the original sacrificial layer.

11 Claims, 5 Drawing Sheets

METHOD OF FORMING AN ELEMENT OF A MICROELECTRONIC CIRCUIT

BACKGROUND OF THE INVENTION

1). Field of the Invention

This invention relates to a method of forming an element of a microelectronic circuit and to a device that includes the element.

2). Discussion of Related Art

Nanotechnology involves the formation of extremely small structures with dimensions on the order of nanometers in multiple directions.

Certain devices, for example, silicon on insulator (SOI) devices, require that a monocrystalline silicon or other monocrystalline semiconductor material be formed on an insulating dielectric layer. Various techniques exist that can be used for creating a monocrystalline semiconductor layer on an insulating layer. Such techniques usually involve the implantation of ions to a specific depth into a monocrystalline semiconductor material, attaching a dielectric layer of another wafer to the semiconductor material, subsequently shearing the semiconductor material at a depth to which the ions are implanted, whereafter a thin layer of semiconductor material remains behind on the dielectric layer. A very thin and uniform semiconductor layer can so be formed on a dielectric layer.

Semiconductor fabrication environments, however, rarely make provision for attachment of wafers to one another and subsequent shearing of the wafers from one another, and are thus ill-equipped for the manufacture of SOI devices.

BRIEF DESCRIPTION OF THE DRAWINGS

The invention is described by way of example with reference to the accompanying drawings, wherein.

DETAILED DESCRIPTION OF THE INVENTION

In the following description, terms such as horizontal, vertical, width, length, height, and thickness are used. These terms are used to describe and define orientations of structures and surfaces relative to one another, and should not be interpreted as pertaining to an absolute frame of reference.

Figure 1:
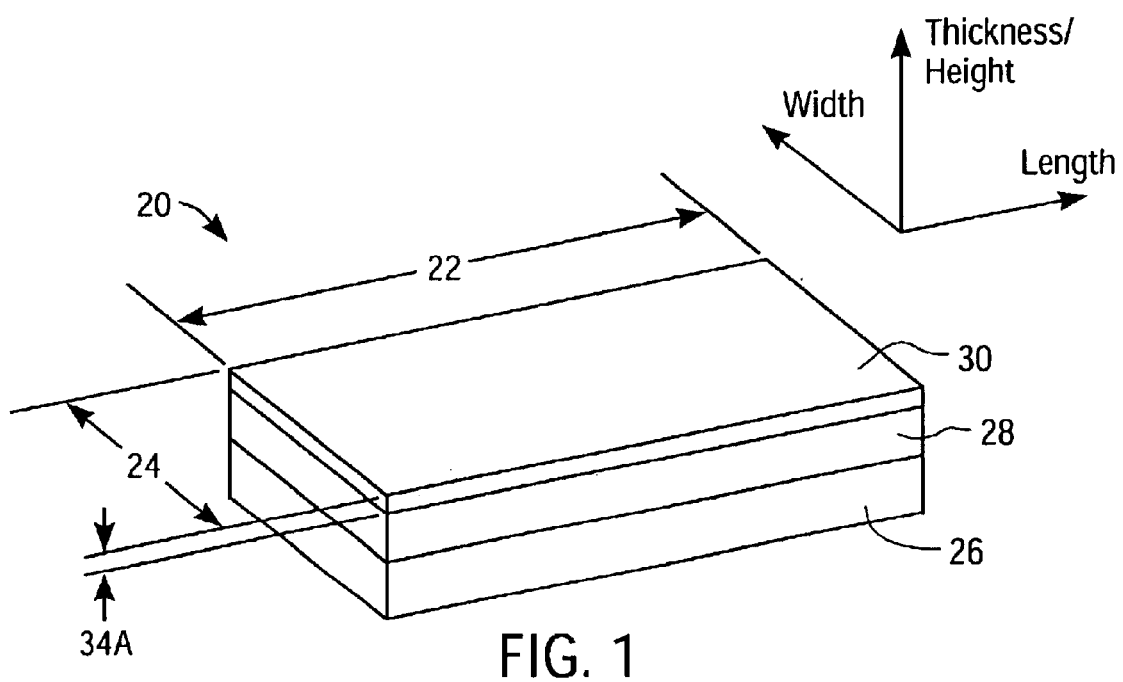
FIG. 1 is a perspective view illustrating a portion out of a wafer including a monocrystalline substrate, a dielectric layer, and a thin and uniform sacrificial layer.

FIG. 1 of the accompanying drawings illustrates a portion 20 out of a partially fabricated wafer, having a width 22 and a length 24. The portion 20 includes a conventional silicon monocrystalline substrate 26, a supporting silicon dioxide ($SiO_2$) dielectric layer 28 formed on the monocrystalline substrate 26, and a silicon nitride ($Si_2NO_3$) sacrificial layer 30 formed on the dielectric layer 28. The substrate may, for example, be silicon (Si), germanium (Ge), silicon germanium ($Si_xGe_y$), gallium arsenide (GaAs), InSb, GaP, GaSb, or carbon. The sacrificial layer 30 has a thickness 34A which is extremely thin, typically on the order of a few nanometers. A process for forming 15 nm thin and uniform silicon nitride layers is, for example, plasma enhanced chemical vapor deposition (CVD) with power of 1 kW, a high frequency of 13.5 MHz, or a low frequency of about 10 kHz with CVD conditions of between 2 and 3 Torr, with temperature of 350–450° C., with silane flow rate of 75–150 sccm, a $N_2O$ flow rate of 10–15 slm, and an $N_2$ flow rate of 20 slm.

Figure 2:
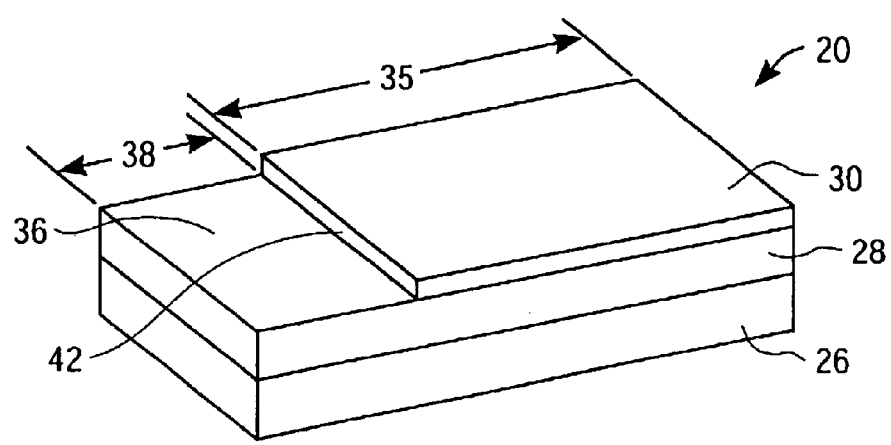
FIG. 2 is a view similar to FIG. 1 after a left portion of the sacrificial layer is etched away.

As illustrated in FIG. 2, a portion of the sacrificial layer 30 is subsequently removed. A remaining portion of the sacrificial layer 30 now has a width 35 and a portion 36 of the dielectric layer is exposed. The portion 36 has a width 38 and extends across the length 24. A side surface 42 of the sacrificial layer 30 is exposed.

Figure 3:
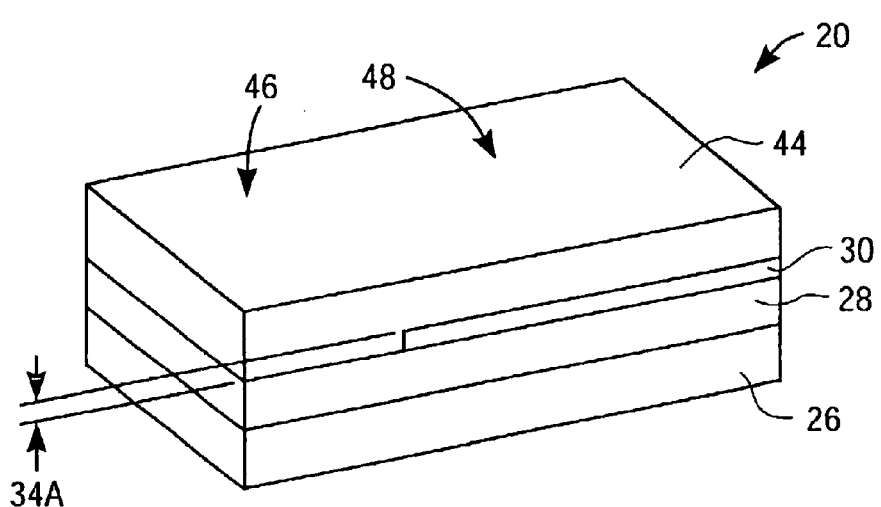
FIG. 3 is a view similar to FIG. 2 after a height-defining layer is formed.

As illustrated in FIG. 3, a height-defining layer 44 is subsequently formed. The height-defining layer 44 is typically made of the same material as the dielectric layer 28. The height-defining layer 44 has a left portion 46 on and structurally connected to the dielectric layer 28, and a right portion 48 having a lower surface on an upper surface of the sacrificial layer 30. A distance between a horizontal upper surface of the dielectric layer 28 and the horizontal lower surface of the right portion 48 is defined by the thickness 34A of the sacrificial layer 30.

Figure 4:
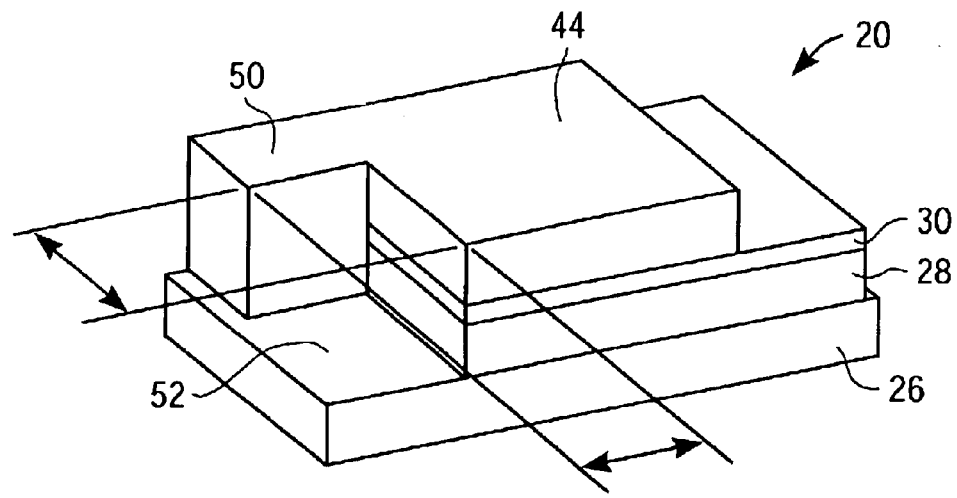
FIG. 4 is a view similar to FIG. 3 after a left front portion of the height-defining layer and the dielectric layer are etched away to leave a nucleation site exposed on the monocrystalline substrate.

FIG. 4 illustrates the structure of FIG. 3 after a front of the left portion 46 is removed. The entire structure of FIG. 3 is masked while leaving an opening above the front of the left portion 46, and then exposing the front of the left portion 46 to an etchant that selectively removes the materials of the dielectric layer 28, the sacrificial layer 30, and the height-defining layer 44 over the material of the monocrystalline substrate 26. The height-defining layer 44 is still structurally connected through a rear portion 50 of the left portion 46 to the dielectric layer 28 and the monocrystalline substrate 26. The side surface 42 of the sacrificial layer 30 is exposed within the portion that has been etched out. A nucleation site 52 is exposed on the monocrystalline substrate 26.

Figure 5:
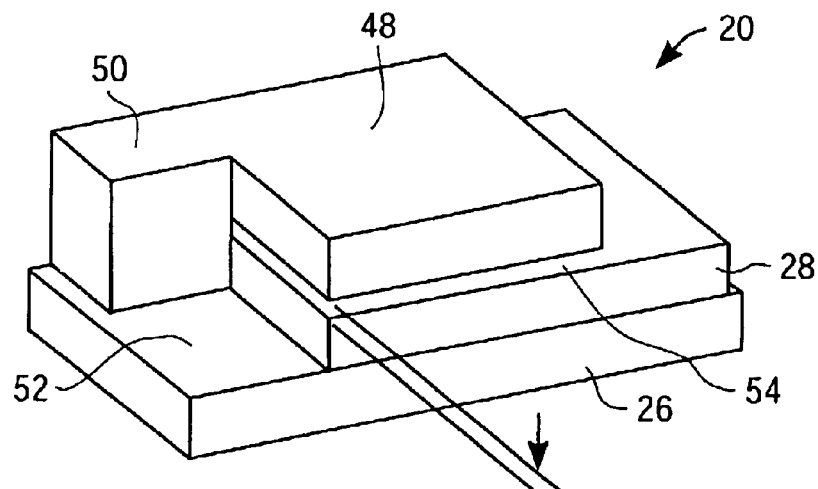
FIG. 5 is a view similar to FIG. 4 after the sacrificial layer is etched to leave a gap between the dielectric layer and a right portion of the height-defining layer.

As illustrated in FIG. 5, the sacrificial layer 30 is subsequently etched away. An etchant is used that selectively removes some material of the sacrificial layer 30 over the materials of the other components illustrated in FIG. 4. The rear portion 50 suspends the right portion 48 above the dielectric layer 28. A gap 34B is defined between the upper surface of the dielectric layer 28 and the lower surface of the right portion 48. The gap 54 has a vertical height 34B that equals the initial thickness 34A of the sacrificial layer 30.

The nucleation site 52 is cleaned in a hydrogen bake step at 200° C. for three minutes with an $H_2$ flow rate of 20 slm at 20 Torr.

Figure 6:
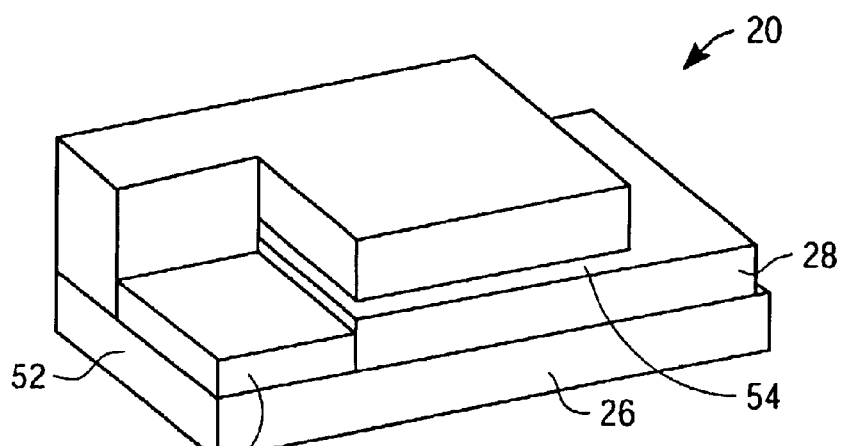
FIG. 6 is a view similar to FIG. 5 after an initial portion of a monocrystalline semiconductor material is grown on the nucleation site.

As illustrated in FIG. 6, growth of monocrystalline semiconductor material 60 is then initiated on the nucleation site 52. Conventional processes that are used for epitaxial growth of silicon may be used for selectively growing the monocrystalline semiconductor material 60, for example, a CVD process is in an ASM E3000 epitaxial reactor at a temperature of 825° C., 240 sccm of $SiH_2CL_2$, 140 sccm HCl, and 20 slm of hydrogen at a pressure of 20 Torr. The monocrystalline semiconductor material 60 grows from the nucleation site 52 vertically upward past a left side surface of the dielectric layer 28. The precleaning of the nucleation site 52 together with the processing conditions ensure that the material 60 is monocrystalline and free of defects. What should be noted is that the gap 54 is open on a side of the monocrystalline semiconductor material 60. As an alternative, $Si_xGe_y$ or another material may be used instead of silicon.

Figure 7:
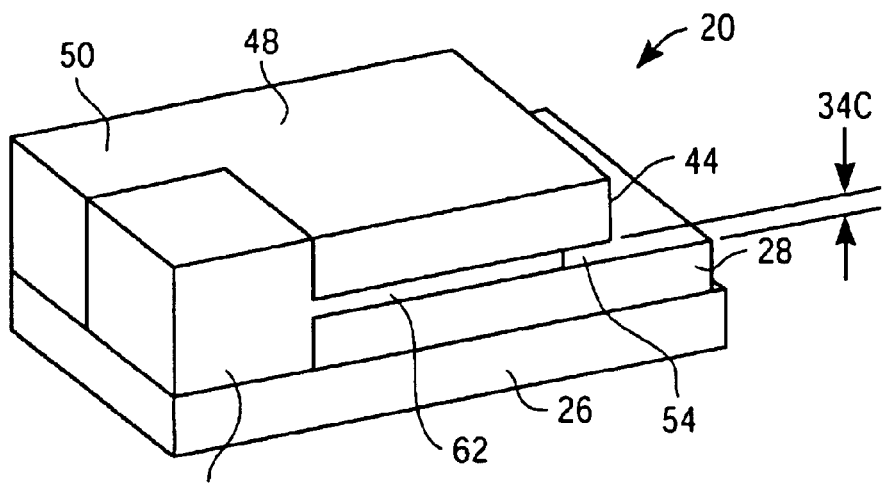
FIG. 7 is a view similar to FIG. 6 after the monocrystalline semiconductor material has grown to form a monocrystalline layer in the gap.

As illustrated in FIG. 7, the monocrystalline semiconductor material 60 subsequently grows from left to right horizontally through the gap 54. A thin monocrystalline layer 62 is so formed in the gap 54. The monocrystalline layer 62 has a thickness 34C that equals the height 34B of the gap 54 and the initial thickness 34A of the sacrificial layer 30. Because the sacrificial layer 30 is extremely thin and has a very uniform thickness, the monocrystalline layer 62 is also extremely thin and has an extremely uniform thickness.

Figure 8:
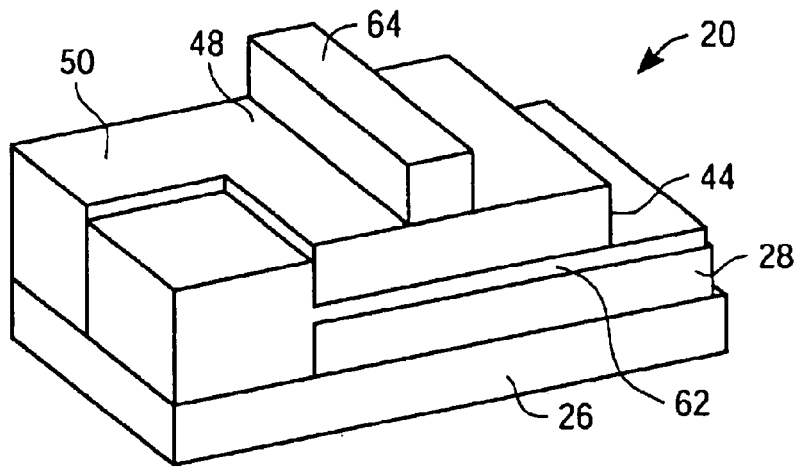
FIG. 8 is a view similar to FIG. 7 after a mask block is formed on the right portion of the height-defining layer.
Figure 9:
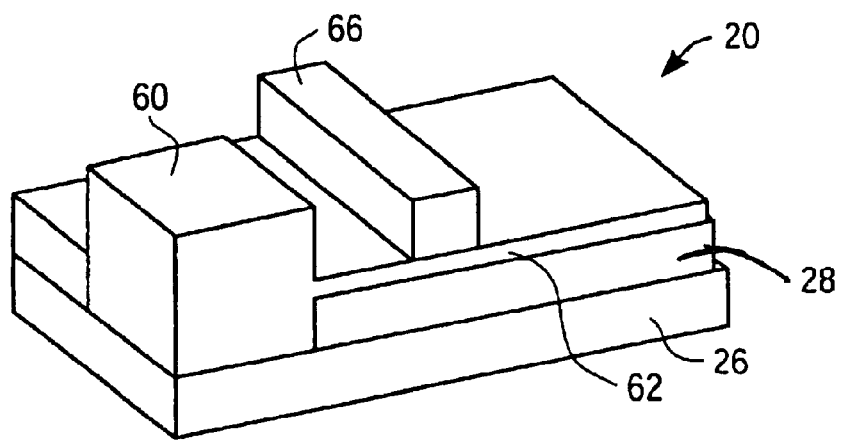
FIG. 9 is a view similar to FIG. 8 after the height-defining layer is etched with the mask block defining the dimensions of a spacer block of the height-defining layer that remains on the monocrystalline layer.

Referring to FIGS. 8 and 9, a mask block 64 is subsequently patterned on the right portion 48 (FIG. 8). The mask block 64 is then used to pattern a spacer block 66 out of the height-defining layer 44, whereafter the mask block 64 is removed (FIG. 9). The spacer block 66 has the same width and length as the mask block 64.

Figure 10:
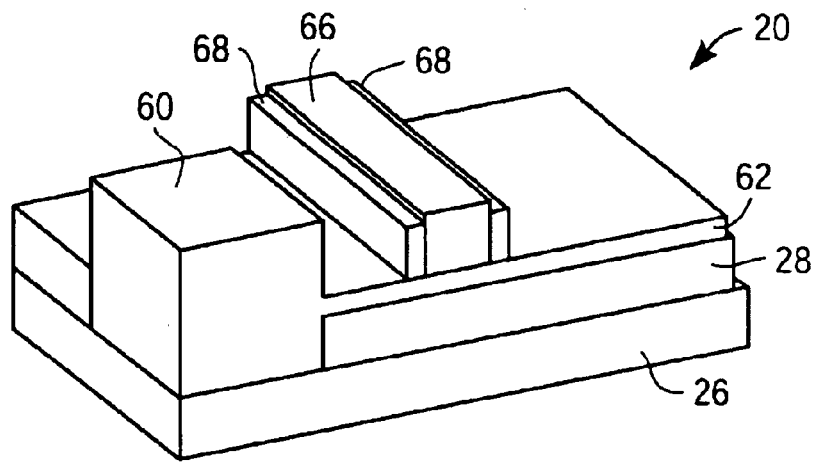
FIG. 10 is a view similar to FIG. 9 after spacer side walls are formed adjacent opposing sides of the spacer block.

As illustrated in FIG. 10, silicon nitride spacer side walls 68 are subsequently formed on opposing sides of the spacer block 66 and on the upper surface of the monocrystalline layer 62. The spacer side walls 68 are formed by depositing a silicon nitride layer conformally over the monocrystalline layer 62 and over opposing side and upper surfaces of the spacer block 66, whereafter the silicon nitride layer is etched back to the leave the spacer side walls 68. An etchant is used that selectively removes silicon nitride over pure monocrystalline silicon and silicon dioxide. An advantage of such a process is that the spacer side walls 68 can be made extremely thin and uniform in thickness. In the given embodiment, therefore, the height-defining layer 44 serves the dual purpose of defining the vertical height 34B of the gap 54 out of which the spacer block 66 is formed for purposes of defining the positions of the spacer side walls 68.

Figure 11:
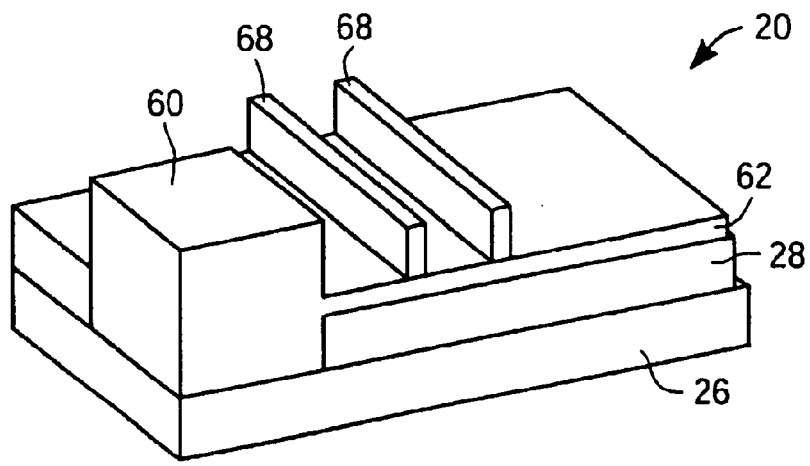
FIG. 11 is a view similar to FIG. 10 after the spacer block is etched away.

As illustrated in FIG. 11, the spacer block 66 is subsequently removed. An entire upper surface of the monocrystalline layer 62 is then exposed, except directly below the spacer side walls 68. An etchant is used and selectively removes silicon dioxide over silicon nitride and pure monocrystalline silicon.

Figure 12:
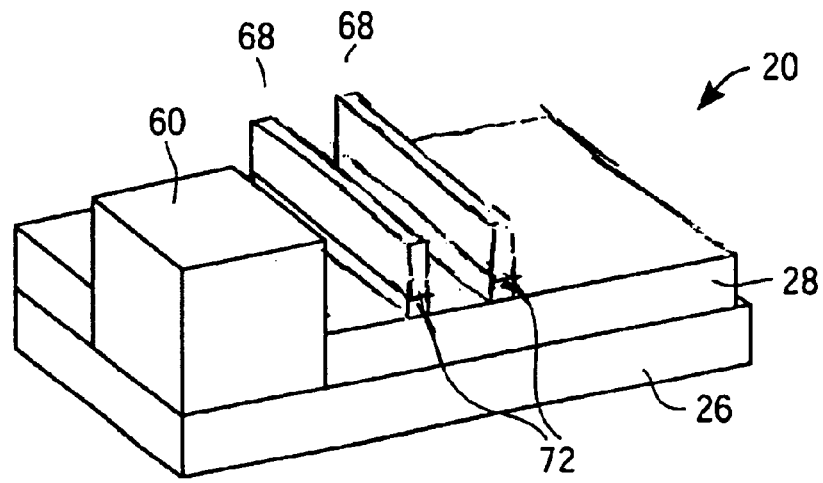
FIG. 12 is a view similar to FIG. 11 after the monocrystalline layer is etched with the spacer side walls serving as a mask, so that monocrystalline wire elements of the monocrystalline layer remain on the dielectric layer.

Referring to FIG. 12, exposed portions of the monocrystalline layer 62 are removed by anisotropically etching the monocrystalline layer 62, with the spacer side walls 68 serving as a mask. What remains of the monocrystalline layer 62 are monocrystalline wire elements 72 directly below the spacer side walls 68.

Figure 13:
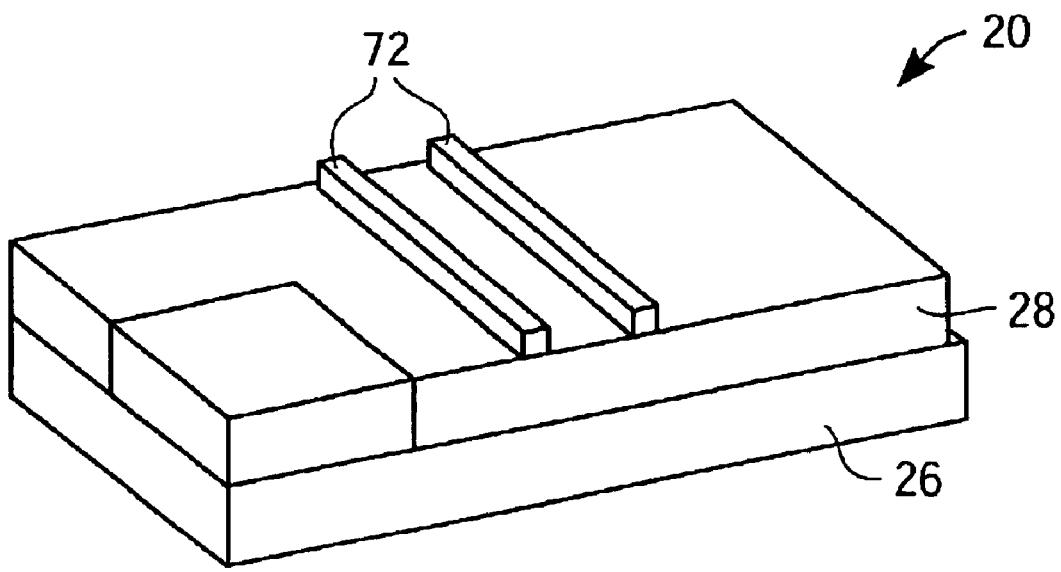
FIG. 13 is a view similar to FIG. 12 after the spacer side walls are etched away.

Referring to FIG. 13, the spacer side walls are subsequently removed with an etchant that selectively removes silicon nitride over pure monocrystalline silicon and silicon dioxide. Upper surfaces of the wire elements 72 are then exposed. Heights of the wire elements 72 are the same as the thickness of the initial sacrificial layer 30, and their widths are defined by the widths of the spacer side walls 68.

Figure 14:
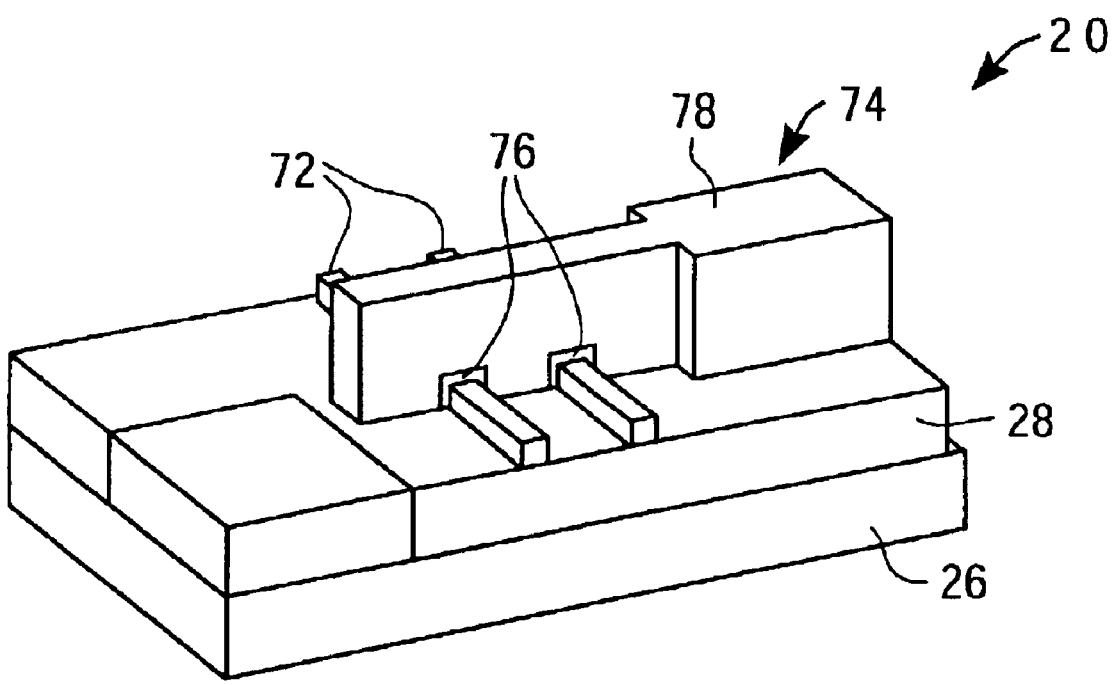
FIG. 14 is a view similar to FIG. 13 illustrating the manufacture of a tri-gate transistor device that includes the wire elements.

As illustrated in FIG. 14, the wire elements 72 may form part of a tri-gate transistor device 74. Each semiconductor wire element 72 is first implanted with P- or N-dopants to make it conductive. A gate dielectric layer 76 is then formed on opposing side and an upper surface of each wire element 72. A conductive gate electrode 78 is then manufactured over upper and side surfaces of both gate dielectric layers 76. The wire elements 72 are then annealed to activate the dopants. A voltage can be applied over the wire elements 72. When a voltage is switched on the gate electrode 78, current flows through the wire elements 72.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of forming an element of a microelectronic circuit, comprising:

forming a sacrificial layer having a lower surface on an upper surface of a support layer;

forming a height-defining layer having a lower surface on an upper surface of the sacrificial layer;

removing the sacrificial layer so that a gap is defined between the upper surface of the support layer and the lower surface of the height-defining layer;

growing a monocrystalline semiconductor material from a nucleation site at least partially through the gap with a height of the semiconductor material being defined by a height of the gap;

patterning the height-defining layer to form a spacer block on the monocrystalline semiconductor material;

forming a spacer side wall on a side of the spacer block by depositing a conformal layer over the monocrystalline semiconductor material and a surface of the spacer block and etching the conformal layer back;

removing the spacer block; and etching the monocrystalline semiconductor material with the spacer side wall serving as a mask, to form a wire element out of the monocrystalline semiconductor material.

2. The method of claim 1, wherein the support layer is an insulator.

3. The method of claim 2, further comprising:

doping the wire element; and forming a conductive gate over and along opposing sides of the wire element.

4. The method of claim 1, wherein the semiconductor material is at least one of silicon (Si), germanium (Ge), silicon germanium ($Si_xGe_y$), gallium arsenide (GaAs), InSb, GaP, GaSb and carbon.

5. The method of claim 1, further comprising:

forming the support layer over a portion of a semiconductor monocrystalline substrate, an open portion of the semiconductor monocrystalline substrate having the nucleation site.

6. A method of forming an element of a microelectronic circuit, comprising:

forming a dielectric layer on a semiconductor monocrystalline substrate;

forming a structure on the semiconductor monocrystalline substrate, having a height-defining layer, a gap being defined between an upper surface of the support layer and a lower surface of the height-defining layer;

growing a monocrystalline semiconductor material from a nucleation site on the semiconductor monocrystalline substrate, the semiconductor material growing at least partially through the gap with a height of the semiconductor material being defined by a height of the gap;

patterning the height-defining layer to form a spacer block on the monocrystalline semiconductor material;

forming a spacer side wall on a side of the spacer block by depositing a conformal layer over the monocrystalline semiconductor material and a surface of the spacer block and etching the conformal layer back;

removing the spacer block; and etching the monocrystalline semiconductor material with the spacer side wall serving as a mask, to form a wire element out of the monocrystalline semiconductor material.

7. The method of claim 6, wherein the support layer is an insulator.

8. The method of claim 7, further comprising:

doping the wire element; and forming a conductive gate over and along opposing sides of the wire element.

9. A method of forming an element of a microelectronic circuit, comprising:

forming an dielectric layer horizontally over a horizontal semiconductor monocrystalline substrate;

forming a sacrificial layer having a horizontal lower surface on a horizontal upper surface of the dielectric layer, the sacrificial layer being of a different material than the dielectric layer;

forming a height-defining layer having a lower surface on a horizontal upper surface of the sacrificial layer, the height-defining layer being of a different material than the sacrificial layer;

removing the sacrificial layer with an etchant that selectively removes the material of the sacrificial layer over the materials of the dielectric layer and the height-defining layer, to leave a gap between the upper surface of the dielectric layer and the lower surface of the height-defining layer, the height-defining layer being maintained in a vertical position relative to the dielectric layer by a support piece on the semiconductor monocrystalline substrate;

growing a monocrystalline semiconductor material from a nucleation site on the semiconductor monocrystalline substrate, the monocrystalline semiconductor material growing horizontally through the at least part of the gap to form a semiconductor layer with a vertical height thereof being limited by a vertical height of the gap;

patterning the height-defining layer to form a spacer block on the monocrystalline semiconductor material;

forming a spacer side wall on a side of the spacer block by depositing a conformal layer over the monocrystalline semiconductor material and a surface of the spacer block and etching the conformal layer back;

removing the spacer block; and etching the monocrystalline semiconductor material with the spacer side wall serving as a mask, to form a wire element out of the monocrystalline semiconductor material.

10. The method of claim 9, further comprising:

doping the wire element; and forming a conductive gate over and along opposing sides of the wire element.

11. The method of claim 9, wherein the semiconductor material grows vertically past the dielectric layer before growing horizontally into the gap.

* * * * *